United States Patent
Dong et al.

(10) Patent No.: US 11,200,953 B2
(45) Date of Patent: *Dec. 14, 2021

(54) METHODS OF PROGRAMMING MEMORY DEVICE

(71) Applicant: YANGTZE MEMORY TECHNOLOGIES CO., LTD., Wuhan (CN)

(72) Inventors: Zhipeng Dong, Wuhan (CN); Venkatagirish Nagavarapu, Wuhan (CN); Haibo Li, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/172,015

(22) Filed: Feb. 9, 2021

(65) Prior Publication Data

US 2021/0166765 A1 Jun. 3, 2021

Related U.S. Application Data

(63) Continuation of application No. 16/714,769, filed on Dec. 15, 2019, now Pat. No. 10,937,504, which is a (Continued)

(51) Int. Cl.
*G11C 16/06* (2006.01)
*G11C 16/10* (2006.01)
*G11C 16/34* (2006.01)

(52) U.S. Cl.
CPC .......... *G11C 16/10* (2013.01); *G11C 16/3459* (2013.01)

(58) Field of Classification Search
CPC .......................... G11C 16/10; G11C 16/3459
See application file for complete search history.

(56) References Cited

U.S. PATENT DOCUMENTS

| | | | | |
|---|---|---|---|---|
| 8,638,603 | B2 * | 1/2014 | Kwak | G11C 16/0483 365/185.03 |
| 8,644,081 | B2 * | 2/2014 | Chang | G11C 16/08 365/185.28 |

(Continued)

FOREIGN PATENT DOCUMENTS

| | | |
|---|---|---|
| CN | 101206922 A | 6/2008 |
| CN | 101385089 A | 3/2009 |

(Continued)

OTHER PUBLICATIONS

International Search Report issued in corresponding International Application No. PCT/CN2019/113926, dated Jul. 30, 2020, 4 pages.

(Continued)

*Primary Examiner* — Pho M Luu
(74) *Attorney, Agent, or Firm* — Bayes PLLC

(57) ABSTRACT

A memory device includes a plurality of memory cells arranged in a plurality of rows and a plurality of strings. A method of programming the memory device includes programming a first row of the memory cells. The method also includes, after programing the first row of the memory cells, programming a second row of the memory cells. The second row is adjacent to the first row in a first string direction. The method further includes, after programming the second row of the memory cells, programming a third row of the memory cells. The third row is two rows apart from the second row in a second string direction opposite to the first string direction.

20 Claims, 7 Drawing Sheets

Related U.S. Application Data continuation of application No. PCT/CN2019/113926, filed on Oct. 29, 2019.

(56) References Cited

U.S. PATENT DOCUMENTS

| | | | |
|---|---|---|---|
| 9,053,793 B2 * | 6/2015 | Kim | G11C 16/06 |
| 10,937,504 B1 * | 3/2021 | Dong | G11C 16/3459 |
| 2007/0103986 A1 | 5/2007 | Chen | |
| 2014/0198570 A1 | 7/2014 | Hsieh | |
| 2015/0371703 A1 | 12/2015 | Lei | |

FOREIGN PATENT DOCUMENTS

| | | |
|---|---|---|
| CN | 101395673 A | 3/2009 |
| CN | 101689400 A | 3/2010 |
| CN | 102027548 A | 4/2011 |
| CN | 104272393 A | 1/2015 |
| CN | 106601293 A | 4/2017 |
| TW | I313865 | 8/2009 |
| TW | 201209831 A1 | 3/2012 |
| TW | I537979 B | 6/2016 |
| WO | 2007079124 A1 | 7/2007 |

OTHER PUBLICATIONS

Written Opinion of the International Searching Authority issued in corresponding International Application No. PCT/CN2019/113926, dated Jul. 30, 2020, 3 pages.

* cited by examiner

METHODS OF PROGRAMMING MEMORY DEVICE

CROSS REFERENCE TO RELATED APPLICATION

This application is a continuation of U.S. application Ser. No. 16/714,769, filed on Dec. 15, 2019, now issued as U.S. Pat. No. 10,937,504, which is a continuation of International Application No. PCT/CN2019/113926, filed on Oct. 29, 2019, both of which are incorporated herein by reference in their entireties.

BACKGROUND

The present disclosure relates to memory control, and in particular, to methods of programming a memory device.

As technology advances, the degree of integration of non-volatile memory has increased to enhance device performance and price competitiveness. However, the increasing degree of integration also increases the amount of signal coupling and interference between memory cells in the non-volatile memory during programming, leading to a reduction in data reliability.

Therefore, methods of programming a memory device are in need to reduce signal coupling and interference, enhancing data reliability and device performance.

SUMMARY

According to an aspect of the present disclosure, a method of programming a memory device is provided. The memory device includes a plurality of memory cells arranged in N rows, N being a positive integer. The method includes programming a first row of the N rows; after programming the first row, programming a $(2m+1)$th row, m being an integer between 1 and $N/2-1$; and immediately after programming the $(2m+1)$th row, programming a $(2m)$th row; and after programming an $(N-2)$th row, programming an Nth row. Even rows closer to the first row are programmed before even rows farther away from the first row.

According to another aspect of the present disclosure, a method of programming a memory device is disclosed. The memory device includes a plurality of memory cells arranged in N rows, N being a positive integer. The method includes programming a $(2m)$th row, m being an integer between 1 and $N/2$; and immediately after programming the $(2m)$th row, programming a $(2m-1)$th row. Even rows closer to a first row of the N rows are programmed before even rows farther away from the first row.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
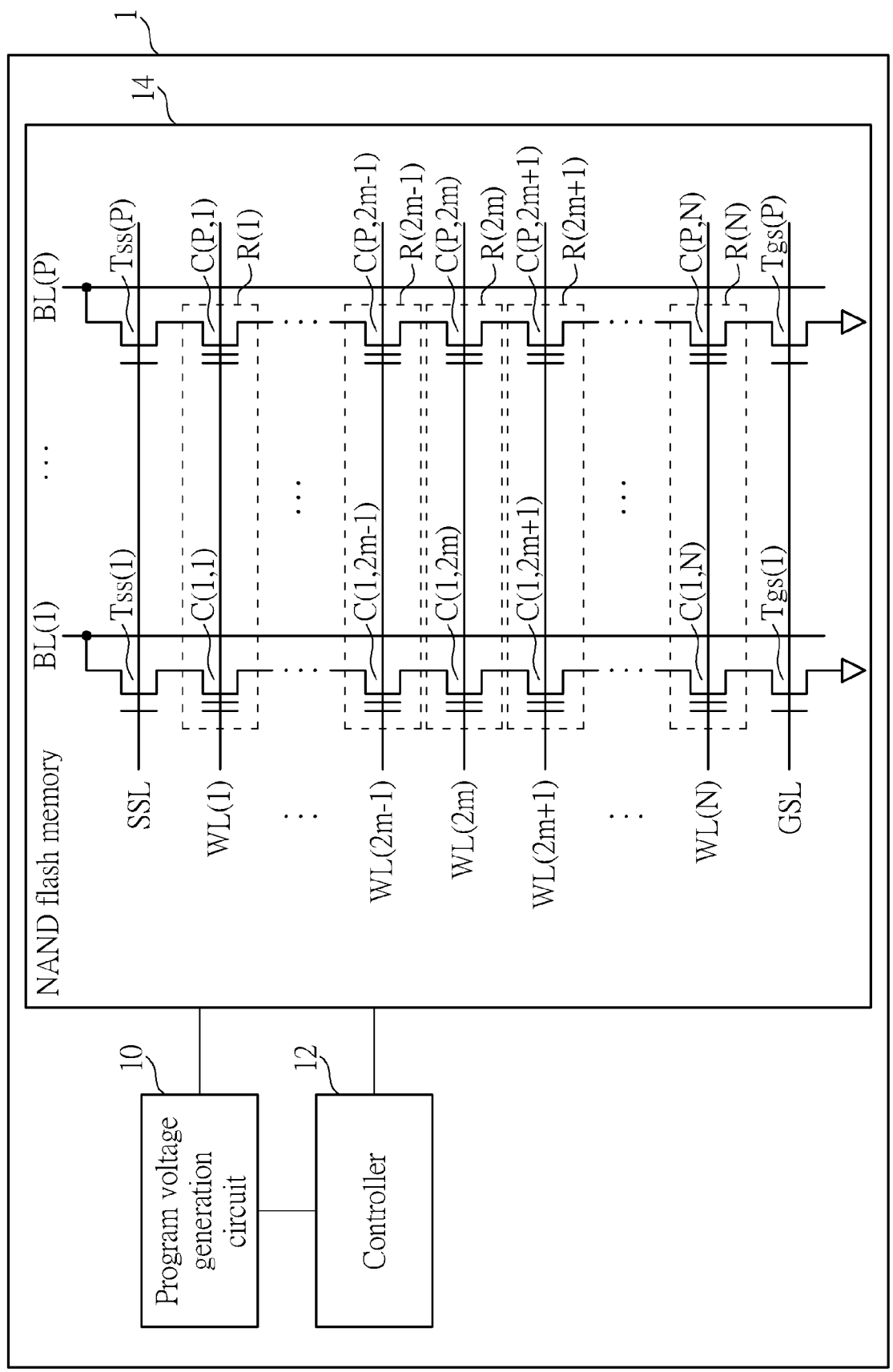
FIG. 1 is a block diagram of a memory device according to an embodiment of the present disclosure.

FIG. 1 is a block diagram of a memory device 1 according to an embodiment of the present disclosure. The memory device 1 may adopt unique program sequences to speed up programming operations while providing satisfactory threshold voltage distributions. The memory device 1 may include a program voltage generation circuit 10, a controller 12 and a NAND flash memory 14. The program voltage generation circuit 10 is coupled to the NAND flash memory 14, and the controller 12 is coupled to the program voltage generation circuit 10 and the NAND flash memory 14 to control reading, programming and/or erasing operations of the NAND flash memory 14.

The NAND flash memory 14 may comprise memory cells $C(1,1)$ to $C(P,N)$, string-select transistors $Tss(1)$ to $Tss(P)$ and ground-select transistors $Tgs(1)$ to $Tgs(P)$. The plurality of memory cells $C(1,1)$ to $C(P,N)$ may be arranged into N rows $R(1)$ to $R(N)$ from top to bottom or bottom to top, and arranged into P cell strings from left to right or right to left, N being a positive integer, e.g., N=64, and P being a positive integer, e.g., P=8192. The memory cells $C(1,1)$ to $C(P,N)$ may be floating-gate transistors or charge-trapping transistors, and may be of a single-level cell (SLC) type, a multi-level cell (MLC) type, a triple-level cell (TLC) type, a quad-level cell (QLC) type, or a higher-level type. Each memory cells $C(p,n)$ may hold one of Q possible states, where p is a positive integer less than or equal to P, n is a positive integer less than or equal to N, and Q is a positive integer equal to or greater than 2, e.g., Q=2 for an SLC, Q=4 for an MLC, Q=8 for a TLC, and Q=16 for a QLC. The program voltage generation circuit 10 may generate program pulses to program the memory cells $C(1,1)$ to $C(P,N)$ into desired program states. Each of the memory cells $C(1,1)$ to $C(P,N)$, the string-select transistors $Tss(1)$ to $Tss(P)$ and the ground-select transistors $Tgs(1)$ to $Tgs(P)$ may include a control terminal, a first terminal, and a second terminal. The control terminals of the memory cells $C(p,1)$ in the row $R(1)$ to the control terminals of the memory cells $C(p,N)$ in the row $R(N)$ may be coupled to word lines $WL(1)$ to $WL(N)$ respectively. The P cell strings may be coupled to bit lines $BL(1)$ to $BL(P)$, respectively. The controller 12 may address the memory cells $C(1,1)$ to $C(P,N)$ using the word lines $WL(1)$ to $WL(N)$ and the bit lines $BL(1)$ to $BL(P)$. The controller 12 may communicate with an external host to receive data for storage in the NAND flash memory 14 and to transmit data fetched from the NAND flash memory 14. The control terminals of the string-select transistors $Tss(1)$ to $Tss(P)$ may be coupled to a string-select line SSL, and the control terminals of the ground-select transistors $Tgs(1)$ to $Tgs(P)$ may be coupled to a ground-select line GSL.

All the memory cells $C(1,1)$ to $C(P,N)$ are initially in an erased state, and some of the memory cells $C(1,1)$ to $C(P,N)$ may be selected and programmed into a target program state using a one-pass programming operation. The one-pass programming operation involves a sequence of multiple programing-verification operations starting from an initial program level and proceeding to a target program level until the threshold voltages of selected memory cells reach one or more respective verification voltage levels of respective target program states. During a programming operation, one or more program pulses may be applied to a selected word line in the word lines WL(1) to WL(N) to set the selected memory cells of the selected word line to the respective target program states, a turn-on voltage, e.g., 1.5V, may be applied to the string-select line SSL to turn on the string-select transistors Tss(1) to Tss(P), and a turn-off voltage, e.g., 0V, may be applied to the ground-select line GSL to turn off the ground-select transistors Tgs(1) to Tgs(P). When programming the selected memory cells into a higher state, a logic state "0" or a ground voltage, e.g., 0V, may be exerted on one or more bit lines BL(p) of the bit lines BL(1) to BL(P); and when not programming the selected memory cells into a higher state, a logic state "1" or a supply voltage, e.g., 1.5V, may be exerted on one or more bit lines BL(p) of the bit lines BL(1) to BL(P).

Figure 2:
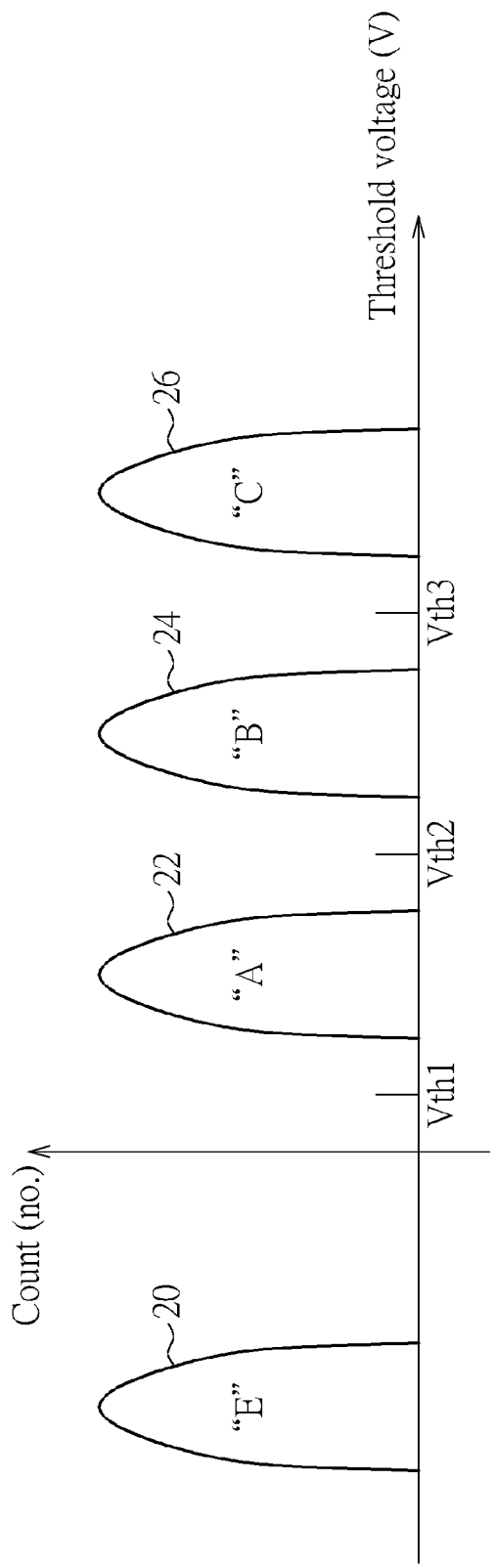
FIGS. 2 and 3 respectively show threshold voltage distributions of memory cells without and with word line coupling.
Figure 3:
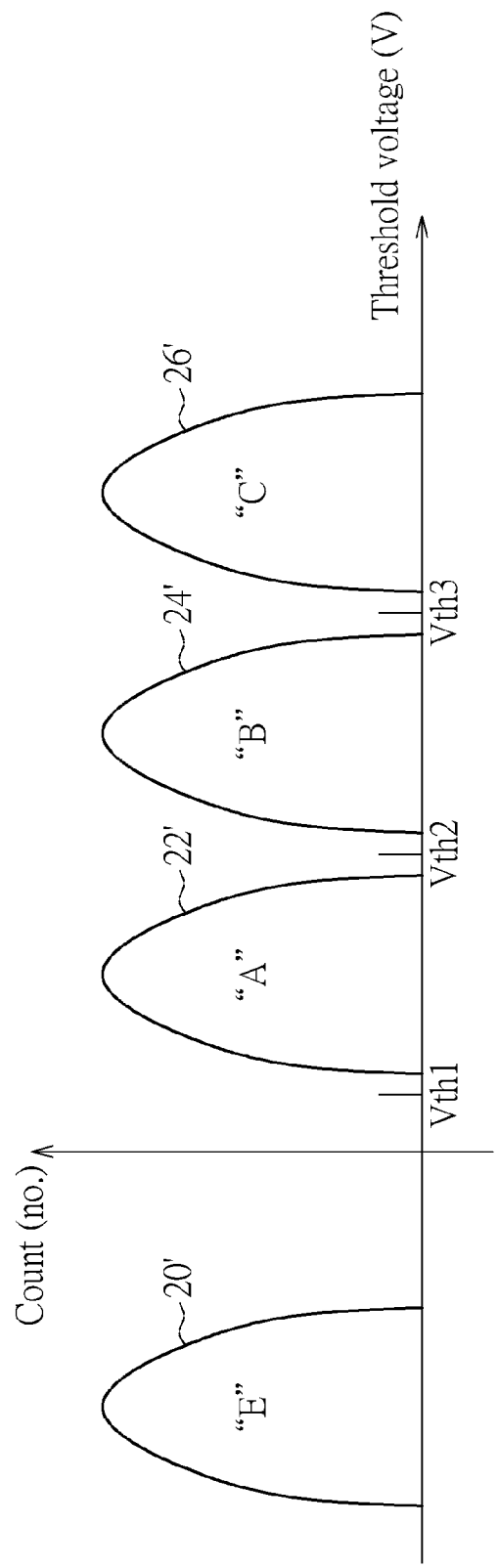

During the programming operation, program pulses may be coupled to unselected word lines that are physically adjacent to the selected word line, shifting, and/or widening threshold voltage distributions of memory cells. FIGS. 2 and 3 respectively show threshold voltage distributions of MLC memory cells without word line coupling and with word line coupling to demonstrate the effect of word line coupling. In FIG. 2, distribution curves 20, 22, 24 and 26 respectively represent threshold voltage distributions of the MLC memory for the states "E", "A", "B", and "C" without word line coupling, and in FIG. 3, distribution curves 20', 22', 24' and 26' respectively represent threshold voltage distributions of the MLC memory cells for the states "E", "A", "B", and "C" with word line coupling.

In FIGS. 2 and 3, voltages Vth1, Vth2, Vth3 respectively represent verification voltage levels or read voltage levels for distinguishing the MLC memory cells between the state "E" and the state "A", the state "A" and the state "B", and the state "B" and the state "C", and may be respectively selected from voltages between the distribution curves 20 and 22, 22 and 24, and 24 and 26. In some embodiments, the voltages Vth1, Vth2, Vth3 may be selected as the minimum threshold voltages of the distribution curves 22', 24', 26', respectively. In the absence of word line coupling, the distribution curves 20, 22, 24 and 26 stay far apart from one another, resulting in accurate reading of data states from the MLC memory cells. However, in the presence of word line coupling, the distribution curves 20', 22', 24' and 26' may expand toward each other, and in some extreme cases, even overlap with each other. Consequently, differentiation between two consecutive states becomes increasingly difficult. The state "E" may occupy a region of negative threshold voltages, or a region substantially covering 0V. The erased state of each memory cell is the lowest state "E", and the target program state of each memory cell is one of states "E", "A", "B", "C". The threshold voltage distribution of the state "E" is typically located far lower than those of the higher states "A", "B", "C", the wider threshold voltage distribution 20' is acceptable, and the word line coupling effect may be ignored for memory cells in the erased state. In contrast, the widened distribution curves 22', 24' and 26' are less tolerable for reading data in the higher states "A", "B", "C", and consequently, the word line coupling effect may have a higher impact on the states "A", "B", "C", and may be considered for memory cells in the programed state.

Figure 4:
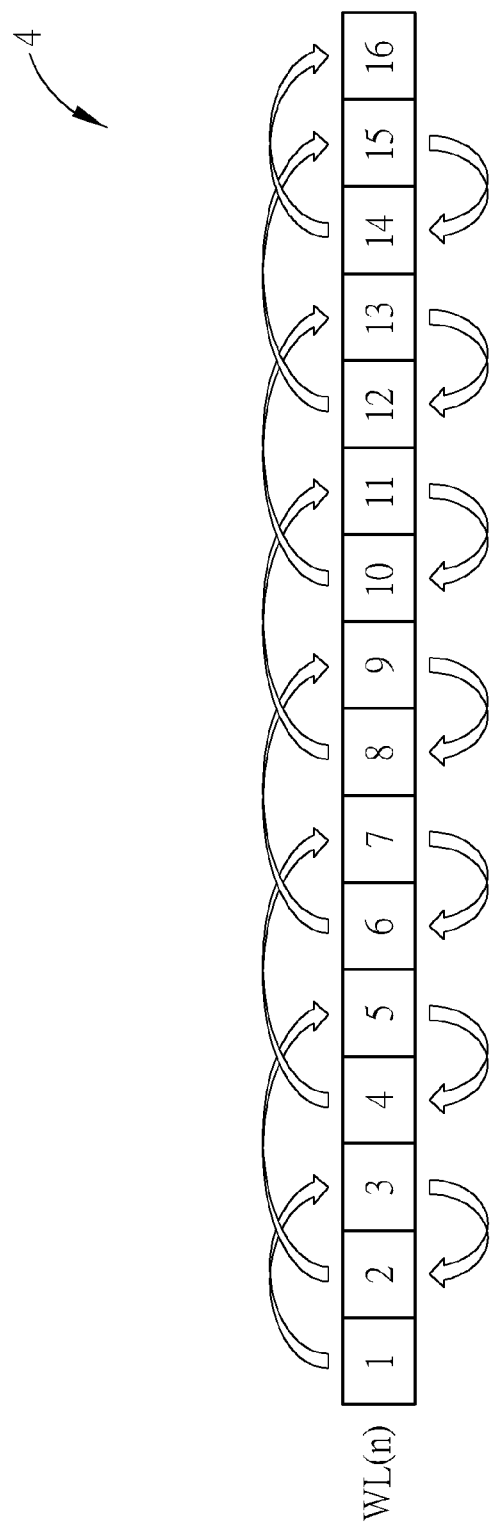
FIG. 4 illustrates an exemplary programming scheme adopted by the memory device in FIG. 1.

The memory device 1 may employ an exemplary program sequence 4 for programming 16 rows of the NAND flash memory 14 as illustrated in FIG. 4 and tabulated in Tables 1A and 1B. The N rows R(1) to R(N) of the NAND flash memory 14 may be divided into odd rows and even rows. The program sequence 4 may reduce or remove word line coupling in the even rows at the expense of widening threshold voltage distributions in the odd rows. During a programming operation, the controller 12 may select a word line WL(n) to program respective data into a selected row according to a programming order of the program sequence 4 as specified in Tables 1A and 1B. The controller 12 may initially program the first row R(1) via the word line WL(1), then proceed the programming alternately for the subsequent odd row R(2*m*+1) and the subsequent even row (2*m*) until the fourteenth row is reached, and lastly, finish the programming at the sixteenth row via the word line WL(16), m being an integer between 1 and 7. In general, the controller 12 may first program a first row of the N rows, program a (2*m*+1)th row after programming the first row, program a (2*m*)th row immediately after programming the (2*m*+1)th row, m being an integer between 1 and (N/2)−1, and program an Nth row after programming an (N−2)th row. The even rows closer to the first row R(1) are programmed before the even rows farther away from the first row R(1). For example, the second row R(2) is programmed before the fourth row R(4), and the fourth row R(4) is programmed before the sixth row R(6). In the embodiment, the program sequence 4 may be (WL(1), WL(3), WL(2), . . . WL(2*m*+1), WL(2*m*), . . . WL(15), WL(14), WL(16)).

TABLE 1A

| WL(n) | WL(1) | WL(2) | WL(3) | WL(4) | WL(5) | WL(6) | WL(7) | WL(8) |
|---|---|---|---|---|---|---|---|---|
| Programming order | 1 | 3 | 2 | 5 | 4 | 7 | 6 | 9 |

TABLE 1B

| WL(n) | WL(9) | WL(10) | WL(11) | WL(12) | WL(13) | WL(14) | WL(15) | WL(16) |
|---|---|---|---|---|---|---|---|---|
| Programming order | 8 | 11 | 10 | 13 | 12 | 15 | 14 | 16 |

The program sequence 4 may result in different amounts of coupling for the odd rows R(1), R(2*m*+1) and the even rows R(2*m*). Since the odd rows R(1), R(2*m*+1) are programmed before the even rows R(2*m*), the odd rows R(1), R(2*m*+1) may receive more word line to word line coupling than the even rows R(2*m*). In some embodiments, the first row R(1) may receive coupling once from the second row R(2), the (2*m*+1)th rows may receive coupling from the neighboring (2*m*)th rows (e.g. the fifth row R(5) receives coupling from both the fourth row R(4) and the sixth row R(6)), and the (2*m*)th row may receive no coupling from the neighboring (2*m*−1)th and (2*m*+1)th rows. As a result, the threshold voltage distributions of the (2*m*)th row may be tighter than the corresponding threshold voltage distributions of the first row R(1), which in turn are tighter than the corresponding threshold voltage distributions of the (2*m*+1)th rows. Since the odd rows R(1), R(2*m*+1) and even rows R(2*m*) may exhibit different threshold voltage distributions, the controller 12 may verify the odd rows R(1), R(2*m*+1) and even rows R(2*m*) using different verification levels. In some embodiments, the controller 12 may verify the odd rows R(1), R(2*m*+1) using a set of odd row verification levels and verify the even rows R(2*m*) using a set of even row verification levels. Both the set of odd row verification levels and the set of even row verification levels contain verification levels corresponding to Q possible states, and an odd row verification level from the set of odd row verification levels and corresponding to a specific state of the Q possible states may be different from an even row verification level from the set of even row verification levels and corresponding to the specific state. In the case where the odd rows R(1), R(2*m*+1) and even rows R(2*m*) show substantially identical threshold voltage distributions, the controller 12 may verify the odd rows R(1), R(2*m*+1) using a set of odd row verification levels substantially identical to a set of even row verification levels for use to verify the even rows R(2*m*).

In some embodiments, the memory device 1 may employ different programming step sizes in an incremental step pulse programming (ISPP) scheme for programming odd rows R(1), R(2*m*+1) and even rows R(2*m*), thereby further accelerating a programming speed, tightening threshold voltage distributions, and enhancing data reliability. In the ISPP scheme, one or more programming pulses may be applied to a selected word line at an increasing magnitude, and each successive programming pulse may exceed the immediately previous programming pulse by a programming step size. The controller 12 may program a selected odd row by controlling the programming voltage generation circuit 10 to generate odd row programming pulses using an odd row programming step size, e.g., 0.4V, and to apply the odd row programming pulses to the selected odd row. Likewise, the controller 12 may program a selected even row by controlling the programming voltage generation circuit 10 to generate even row programming pulses using an even row programming step size, e.g., 0.6V, and to apply the even row programming pulses to the selected even row. The even row programming step size may exceed the odd row programming step size.

Figure 5:
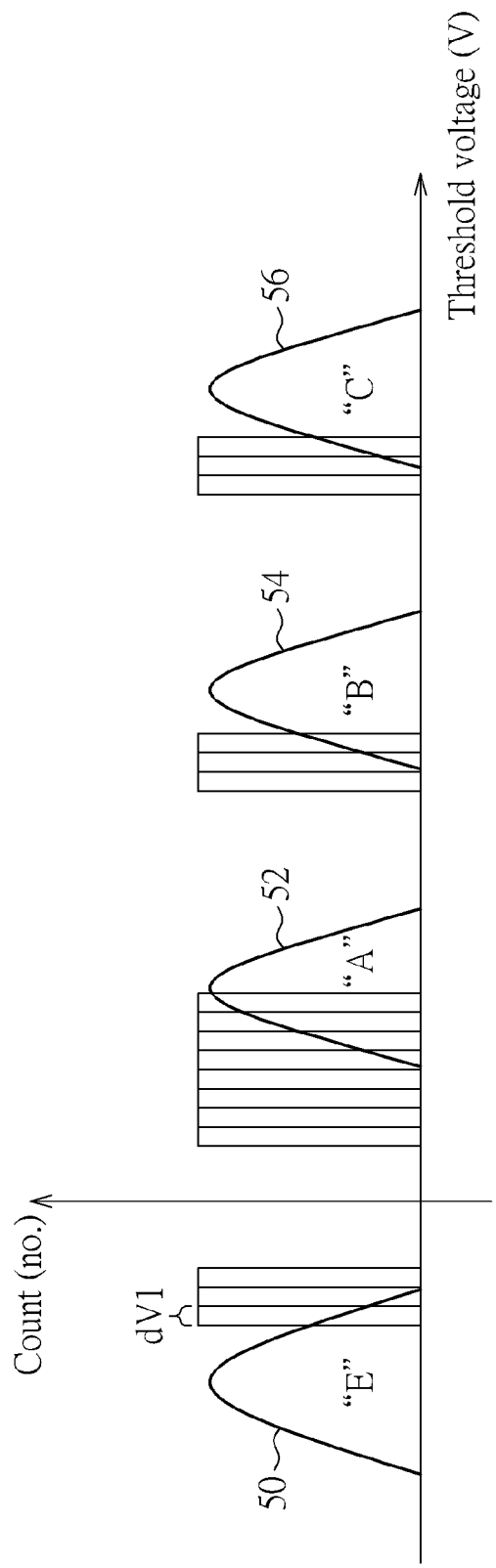
FIGS. 5 and 6 illustrate exemplary threshold voltage distributions resulting from incremental step pulse programming using different programming step sizes.
Figure 6:
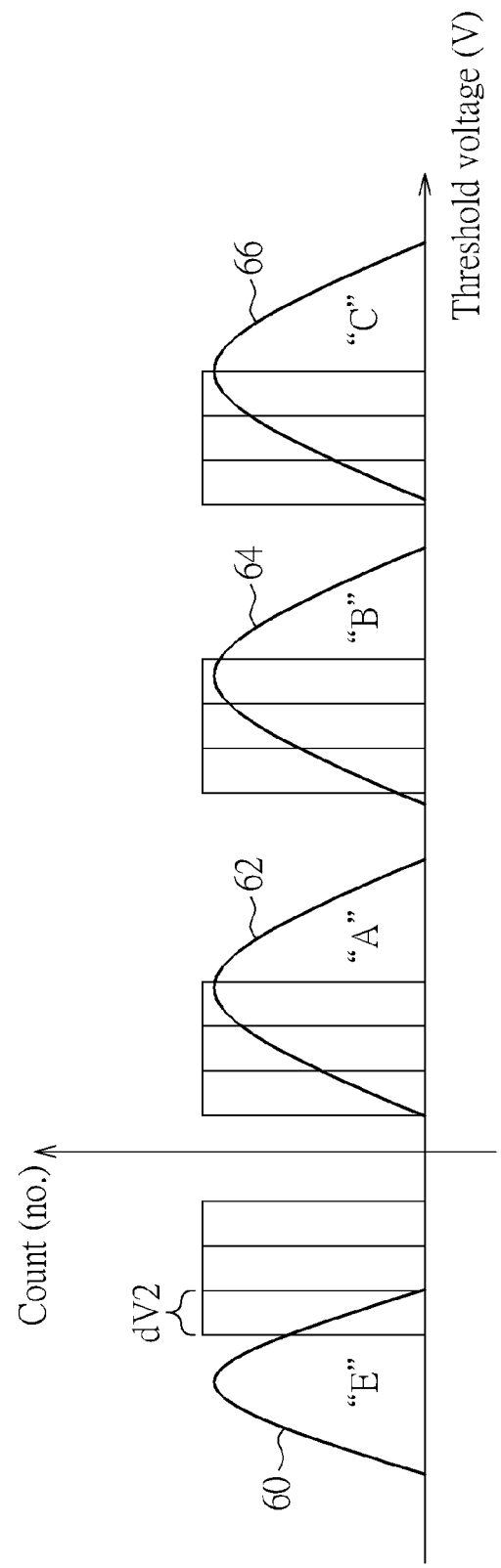

FIGS. 5 and 6 show the effect of programming step sizes on the threshold voltage distributions. FIG. 5 illustrates exemplary threshold voltage distributions 50, 52, 54, 56 of MLC memory cells for the states "E", "A", "B", "C" resulting from ISPP using a programming step size dV1. FIG. 6 illustrates exemplary threshold voltage distributions 60, 62, 64, 66 of the MLC memory cells for the states "E", "A", "B", "C" resulting from ISPP using a programming step size dV2. The programming step size dV1 may be smaller than the programming step size dV2. By adopting the smaller programming step size dV1, the threshold voltage distributions 50, 52, 54, 56 may be tightened at the cost of increasing the programming time. In contrast, by adopting the larger programming step size dV2, the threshold voltage distributions 60, 62, 64, 66 may be widened to the advantage of reducing the programming time. Accordingly, the controller 12 may use a smaller odd row programming step size to tighten the threshold voltage distributions and mitigate the data loss, and use a larger even row programming step size to speed up the programming time and deliver acceptable data reliability, thereby increasing overall data reliability and device performance.

Although a 2-dimensional planer memory structure has been implemented in the NAND flash memory 14, those skilled in the art would appreciate that a 3-dimensional stacked structure and/or a NOR flash memory structure may be adopted in NAND flash memory 14.

By adopting a program sequence having the same principle as the program sequence 4 and different programming step sizes for odd rows and even rows, the memory device 1 can enhance overall data reliability and device performance.

Figure 7:
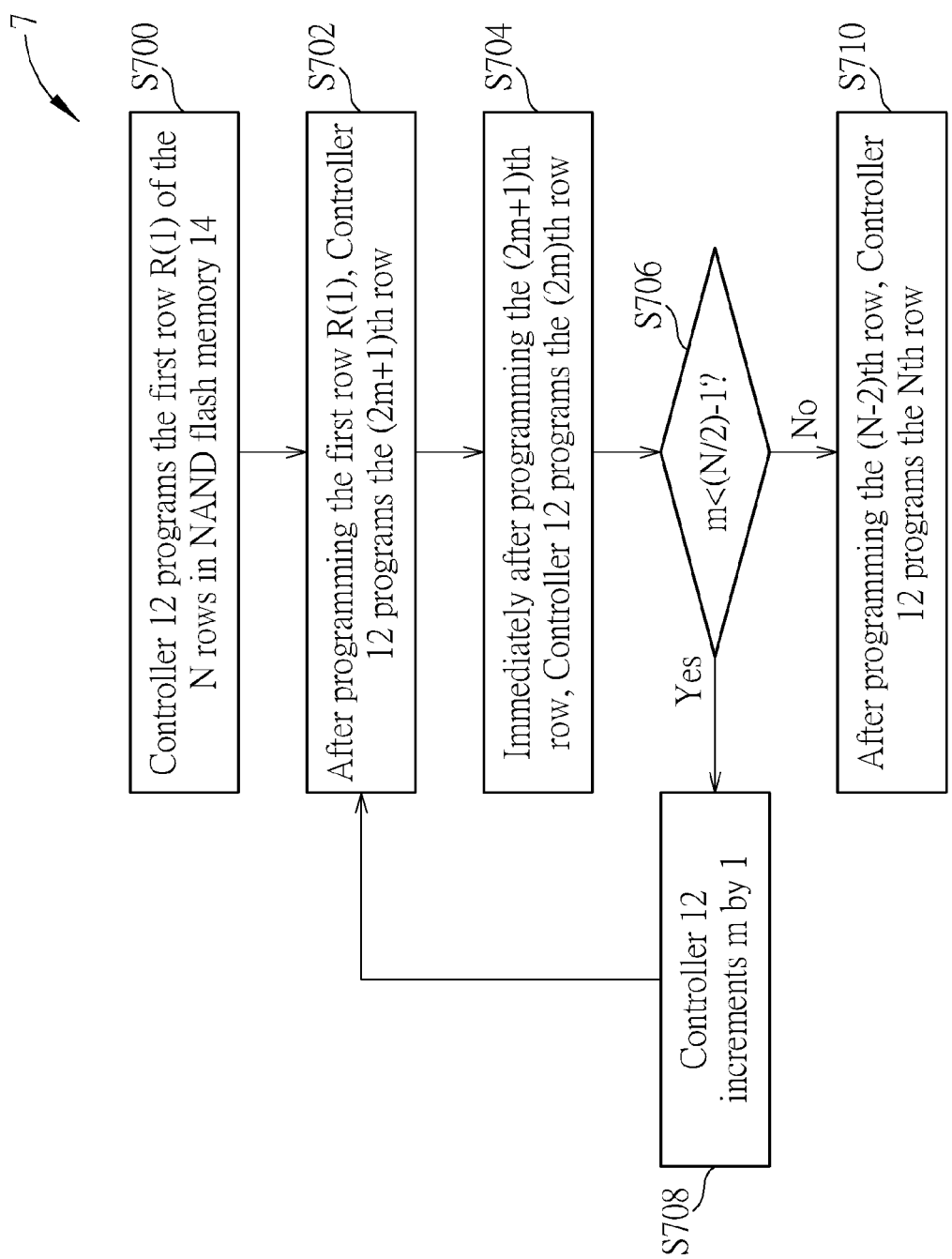
FIG. 7 is a flowchart of a programming method implementing the programming scheme in FIG. 4.

FIG. 7 is a flowchart of a programming method 7 for use by the memory device 1. The programming method 7 comprises Steps S700 to S710 for programming the N rows of the memory cells C(1,1) to C(P,N) in the NAND flash memory 14, Any reasonable step change or adjustment is within the scope of the disclosure. Steps S700 to S710 are explained as follows:

Step S700: Controller 12 programs the first row R(1) of the N rows in NAND flash memory 14.

Step S702: After programming the first row R(1), Controller 12 programs the (2*m*+1)th row.

Step S704: Immediately after programming the (2*m*+1)th row, Controller 12 programs the (2*m*)th row.

Step S706: Controller 12 determines whether m is less than (N/2)−1? If so, go to Step S708; and if not, go to Step S710.

Step S708: Controller 12 increments m by 1; and go to Step S702.

Step S710: After programming the (N−2)th row, Controller 12 programs the Nth row.

The programming method 7 may be exemplified using the program sequence 4 to illustrate details of Steps. The controller 12 starts a programming operation for 16 rows (N=16) from the first row R(1) (S700). After programming the first row R(1), the controller 12 next programs the 3rd row R(3) (m is an integer between 1 and (N/2)−1 and m starts at 1, 2*m*+1=3) (S702). Immediately after programming the 3rd row R(3), the controller 12 programs the 2nd row R(2) (m=1, 2*m*=2). Next, the controller 12 determines that m is less than 7 (m=1, N=16, (N/2)−1=7) (S706) and increments m by 1 (m=2) (S708). The controller 12 loops through Steps S702 to S708 until the 14th row R(14) (m=7, 2*m*=14) is reached. After programming the 14th row R(14) (N=16, N−2=14), the controller 12 programs the 16th row R(16) (N=16) in Step S710, thereby completing the programming method 7.

The programming method 7 may be adopted by the memory device 1 to enhance overall data reliability and device performance.

Figure 8:
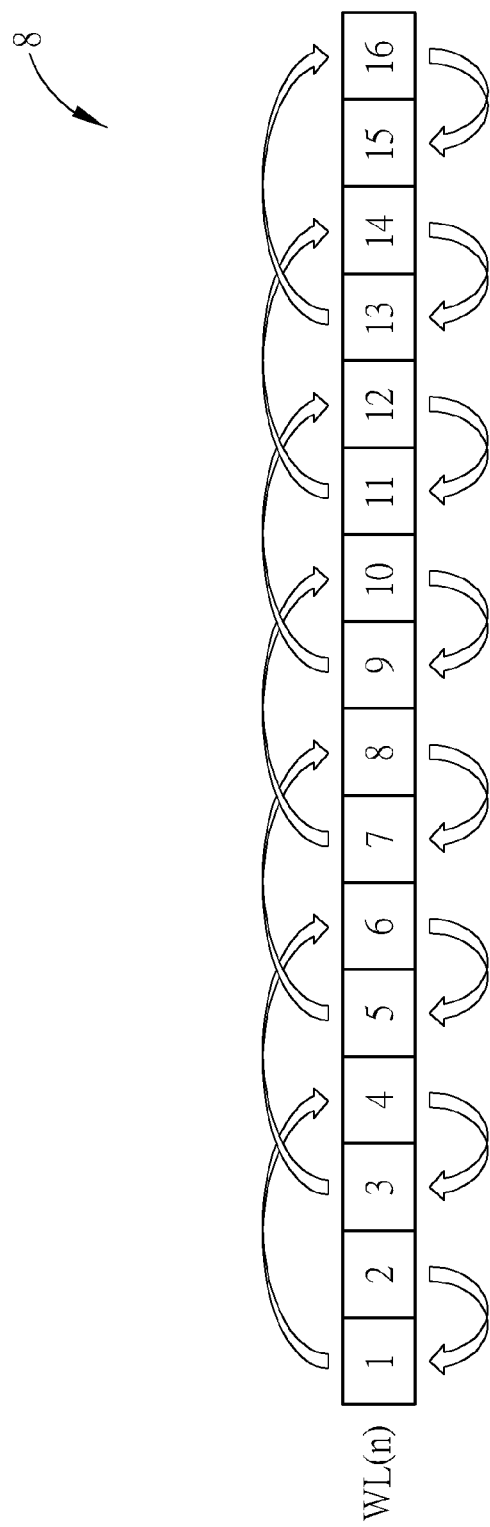
FIG. 8 illustrates another exemplary programming scheme adopted by the memory device in FIG. 1.

The memory device 1 may employ another exemplary program sequence 8 for programming 16 rows of the NAND flash memory 14 as illustrated in FIG. 8 and tabulated in Tables 2A and 2B. The program sequence 8 may reduce or remove word line to word line coupling in odd rows at the expense of widening threshold voltage distributions in the even rows. During a programming operation, the controller 12 may select a word line WL(n) to perform data programming according to a programming order of the program sequence 8. The controller 12 may initially program the second row R(2) via the word line WL(2), and immediately after programming the second row R(2), programs the first row R(1) via the word line WL(1), and proceeds the programming alternately for the subsequent even row and the subsequent odd row until the fifteenth row is reached. In general, the controller 12 may program a (2m)th row, m being an integer between 1 and N/2, and immediately after programming the (2m)th row, program a (2m−1)th row. The even rows closer to the first row R(1) are programmed before the even rows farther away from the first row R(1). In the embodiment, the program sequence 4 may be (WL(2), WL(1), WL(3), WL(2), . . . WL(2m), WL(2m−1), . . . WL(16), WL(15)).

TABLE 2A

| WL(n) | 1 | 2 | 3 | 4 | 5 | 6 | 7 | 8 |
|---|---|---|---|---|---|---|---|---|
| Program sequence | 2 | 1 | 4 | 3 | 6 | 5 | 8 | 7 |

TABLE 2B

| WL(n) | 9 | 10 | 11 | 12 | 13 | 14 | 15 | 16 |
|---|---|---|---|---|---|---|---|---|
| Program sequence | 10 | 9 | 12 | 11 | 14 | 13 | 16 | 15 |

The program sequence 8 may result in different amounts of coupling in the odd rows R(2m) and the even rows R(2m−1) of the NAND flash memory 14. Since the even rows R(2m) are programmed before the odd rows R(2m−1), the even rows R(2m) may receive more word line to word line coupling than the odd rows R(2m−1). In some embodiments, the even rows R(2m) may receive coupling from the neighboring (2m−1)th and (2m+1)th rows R(2m−1), R(2m+1), except R(16), which only receive coupling from R(15). And the odd rows R(2m−1) may receive no coupling. As a result, the threshold voltage distributions of the odd rows R(2m−1) row may be tighter than the corresponding threshold voltage distributions of the even rows R(2m). Since the odd rows R(2m−1) and even rows R(2m) may exhibit different threshold voltage distributions, the controller 12 may verify the odd rows R(2m−1) and even rows R(2m) using different verification levels. In some embodiments, the controller 12 may verify the odd rows R(2m−1) using a set of odd row verification levels and verify the even rows R(2m) using a set of even row verification levels. Both the set of odd row verification levels and the set of even row verification levels contain verification levels corresponding to Q possible states, and an odd row verification level from the set of odd row verification levels and corresponding to a specific state of the Q possible states may be different from an even row verification level from the set of even row verification levels and corresponding to the specific state. In the case where the odd rows R(2m−1) and even rows R(2m) show substantially identical threshold voltage distributions, the controller 12 may verify the odd rows R(2m−1) using a set of odd row verification levels substantially identical to a set of even row verification levels for use to verify the even rows R(2m).

In some embodiments, the memory device 1 may employ different programming step sizes in an incremental step pulse programming (ISPP) scheme for programming the odd rows R(2m−1) and the even rows R(2m), thereby further accelerating a programming speed, tightening threshold voltage distributions, and enhancing data reliability. The controller 12 may program a selected even row by controlling the programming voltage generation circuit 10 to generate even row programming pulses using an even row programming step size, e.g., 0.4V, and to apply the even row programming pulses to the selected even row. Likewise, the controller 12 may program a selected odd row by controlling the programming voltage generation circuit 10 to generate odd row programming pulses using an odd row programming step size, e.g., 0.6V, and to apply the odd row programming pulses to the selected odd row. The even row programming step size may be less than the odd row programming step size. Since the even rows R(2m) may have wider threshold voltage distributions, the controller 12 may use a smaller even row programming step size (e.g., 0.4V) to tighten the threshold voltage distributions and mitigate the data loss, and since the odd rows R(2m−1) may have tighter threshold voltage distributions, the controller 12 may use a larger odd row programming step size (e.g., 0.6V) to speed up the programming time and deliver acceptable data reliability, thereby increasing overall data reliability and device performance.

By adopting a program sequence having the same principle as the program sequence 8 and different programming step sizes for odd rows and even rows, the memory device 1 can enhance overall data reliability and device performance.

Figure 9:
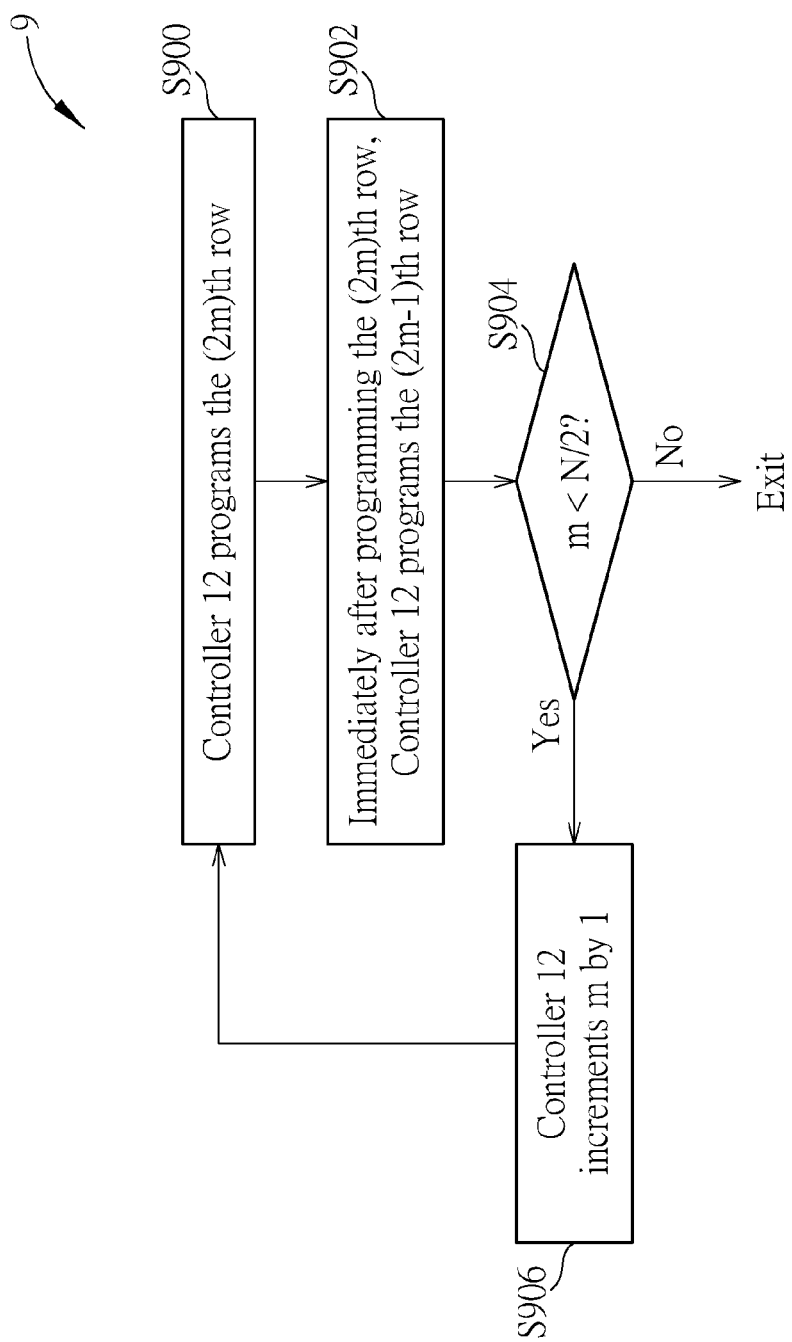
FIG. 9 is a flowchart of another programming method implementing the programming scheme in FIG. 8.

FIG. 9 is a flowchart of another programming method 9 for use by the memory device 1. The programming method 9 comprises Steps S900 to S906 for programming the N rows of the memory cells C(1,1) to C(P,N) in the NAND flash memory 14, Any reasonable step change or adjustment is within the scope of the disclosure. Steps S900 to S906 are explained as follows:

Step S900: Controller 12 programs the (2m)th row.
Step S902: Immediately after programming the (2m)th row, Controller 12 programs the (2m−1)th row.
Step S904: Controller 12 determines whether m is less than N/2? If so, go to Step S906; and if not, exit the programming method 9.
Step S906: Controller 12 increments m by 1; go to Step S900.

The programming method 9 may be exemplified using the program sequence 8 to illustrate details of Steps. The controller 12 starts a programming operation for 16 rows (N=16) from the second row R(2) (m is an integer between 1 and (N/2) and m starts at 1, 2m=2) (S900). Immediately after programming the first row R(1), the controller 12 programs the first row R(1) (m=1, 2m−1=1) (S902). Next, the controller 12 determines that m is less than 8 (m=1, N=16, (N/2)=8) (S904) and increments m by 1 (m=2) (S906). The controller 12 loops through Steps S900 to S906 until m=8 is reached. After programming the fifteenth row R(15) (m=8, 2m−1=15), the controller 12 exits the programming method 9.

The programming method 9 may be adopted by the memory device 1 to enhance overall data reliability and device performance.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:
1. A method of programming a memory device, the memory device comprising a plurality of memory cells arranged in a plurality of rows and a plurality of strings, the method comprising:

programming a first row of the memory cells;
after programing the first row of the memory cells, programming a second row of the memory cells, the second row being adjacent to the first row in a first string direction; and
after programming the second row of the memory cells, programming a third row of the memory cells, the third row being two rows apart from the second row in a second string direction opposite to the first string direction.

2. The method of claim 1, wherein the first string direction is from a string-select transistor to a ground-select transistor.

3. The method of claim 1, wherein the first string direction is from a ground-select transistor to a string-select transistor.

4. The method of claim 1, wherein
programming the first row of the memory cells comprises applying a first row programming pulse having a first row programming step size; and
programming the second row of the memory cells comprises applying a second row programming pulse having a second row programming step size greater than the first row programming step size.

5. The method of claim 4, wherein programming the third row of the memory cells comprises applying a third row programming pulse having a third row programming step size the same as the first row programming step size.

6. The method of claim 4, wherein
programming the first row of the memory cells further comprises after applying the first row programming pulse, verifying the first row of the memory cells using a first verification level; and
programming the second row of the memory cells further comprises after applying the second row programming pulse, verifying the second row of the memory cells using a second verification level different from the first verification level.

7. The method of claim 1, further comprising:
after programming the third row of the memory cells, programming a fourth row of the memory cells, the fourth row being adjacent to the third row in the first string direction; and
after programming the fourth row of the memory cells, programming a fifth row of the memory cells, the fifth row being two rows apart from the fourth row in the second string direction.

8. The method of claim 1, further comprising:
prior to programming the first row of the memory cells, programming a sixth row of the memory cells, the sixth row being two rows apart from the first row in the first string direction.

9. The method of claim 1, further comprising:
prior to programming the first row of the memory cells, programming a seventh row of the memory cells, the seventh row being one row apart from the first row in the first string direction,
wherein the seventh row is one of the plurality of rows that is closest to a string-select transistor or a ground-select transistor.

10. The method of claim 1, wherein the first row is an odd row, and the second row is an even row.

11. The method of claim 1, wherein the first row is an even row, and the second row is an odd row.

12. A memory device, comprising:
a NAND flash memory comprising a plurality of memory cells arranged in a plurality of rows and a plurality of strings, the plurality of rows being coupled to a plurality of word lines, respectively, and the plurality of strings being coupled to a plurality of bit lines, respectively; and
a controller coupled to the NAND flash memory and configured to:
control programming a first row of the memory cells;
after programing the first row of the memory cells, control programming a second row of the memory cells, the second row being adjacent to the first row in a first string direction; and
after programming the second row of the memory cells, control programming a third row of the memory cells, the third row being two rows apart from the second row in a second string direction opposite to the first string direction.

13. The memory device of claim 12, wherein the first string direction is from a string-select transistor to a ground-select transistor.

14. The memory device of claim 12, wherein the first string direction is from a ground-select transistor to a string-select transistor.

15. The memory device of claim 12, further comprising a program voltage generation circuit coupled to the controller and the NAND flash memory and configured to:
in programming the first row of the memory cells, apply a first row programming pulse having a first row programming step size; and
in programming the second row of the memory cells, apply a second row programming pulse having a second row programming step size greater than the first row programming step size.

16. The memory device of claim 15, wherein the program voltage generation circuit is further configured to, in programming the third row of the memory cells, apply a third row programming pulse having a third row programming step size the same as the first row programming step size.

17. The memory device of claim 15, wherein the controller is further configured to:
in programming the first row of the memory cells, after the first row programming pulse is applied, control verifying the first row of the memory cells using a first verification level; and
in programming the second row of the memory cells, after the second row programming pulse is applied, control verifying the second row of the memory cells using a second verification level different from the first verification level.

18. The memory device of claim 12, wherein the controller is further configured to:
after programming the third row of the memory cells, control programming a fourth row of the memory cells, the fourth row being adjacent to the third row in the first string direction; and
after programming the fourth row of the memory cells, control programming a fifth row of the memory cells, the fifth row being two rows apart from the fourth row in the second string direction.

19. The memory device of claim 12, wherein the controller is further configured to:
prior to programming the first row of the memory cells, control programming a sixth row of the memory cells, the sixth row being two rows apart from the first row in the first string direction.

20. The memory device of claim 12, wherein the controller is further configured to:
prior to programming the first row of the memory cells, control programming a seventh row of the memory cells, the seventh row being one row apart from the first row in the first string direction,
wherein the seventh row is one of the plurality of rows that is closest to a string-select transistor or a ground-select transistor.

\* \* \* \* \*